United States Patent
Takai

[19]

[11] Patent Number: 6,144,617
[45] Date of Patent: Nov. 7, 2000

[54] SYNCHRONOUS SEMICONDUCTOR STORAGE DEVICE

[75] Inventor: Yasuhiro Takai, Tokyo, Japan

[73] Assignee: NEC Corporation, Tokyo, Japan

[21] Appl. No.: 09/489,943

[22] Filed: Jan. 24, 2000

[30] Foreign Application Priority Data

Jan. 25, 1999 [JP] Japan .................................. 11-016273

[51] Int. Cl.[7] .................................................. G11C 8/00
[52] U.S. Cl. .................. 365/233.5; 365/233; 365/230.08
[58] Field of Search ................................ 365/233.5, 233, 365/230.08, 194, 189.05

[56] References Cited

U.S. PATENT DOCUMENTS

| | | | |
|---|---|---|---|
| 5,661,751 | 8/1997 | Johnson | 375/219 |
| 5,808,961 | 9/1998 | Sawada | 365/233 |
| 5,815,462 | 9/1998 | Konishi et al. | 365/233 |
| 6,021,077 | 2/2000 | Nakaoka | 365/221 |

FOREIGN PATENT DOCUMENTS

| | | |
|---|---|---|
| 10-504129 | 4/1998 | Japan . |
| 96/29637 | 9/1996 | WIPO . |

*Primary Examiner*—Son T. Dinh
*Assistant Examiner*—Hien Nguyen

*Attorney, Agent, or Firm*—Foley & Lardner

[57] ABSTRACT

A synchronous semiconductor storage device (e.g., synchronous DRAM) contains a memory cell array consisting of memory cells, which are arranged in a matrix form in accordance with rows and columns. The memory cell array is accessed using row addresses and column addresses, which are made in synchronization with cycles of a clock signal being given from the external. When an active command is applied to the synchronous semiconductor storage device, a row address is designated so that a corresponding row of the memory cell array is activated. A first control signal is produced after a lapse of a predetermined delay time, which elapses from timing of the active command. A second control signal is produced after timing of a read command. In addition, a third control signal consisting of pulses is produced based on either the first control signal or second control signal which is delayed. A column address is designated in response to the third control signal, so that a specific memory cell is designated to enable a read operation. When a gap occurs in read operations so that the second control signal is delayed from the first control signal, a basis for creation of the third control signal is changed over from the first control signal to the second control signal. Incidentally, the first control signal is stopped in a period of time in which the third control signal is produced from the second control signal.

10 Claims, 9 Drawing Sheets

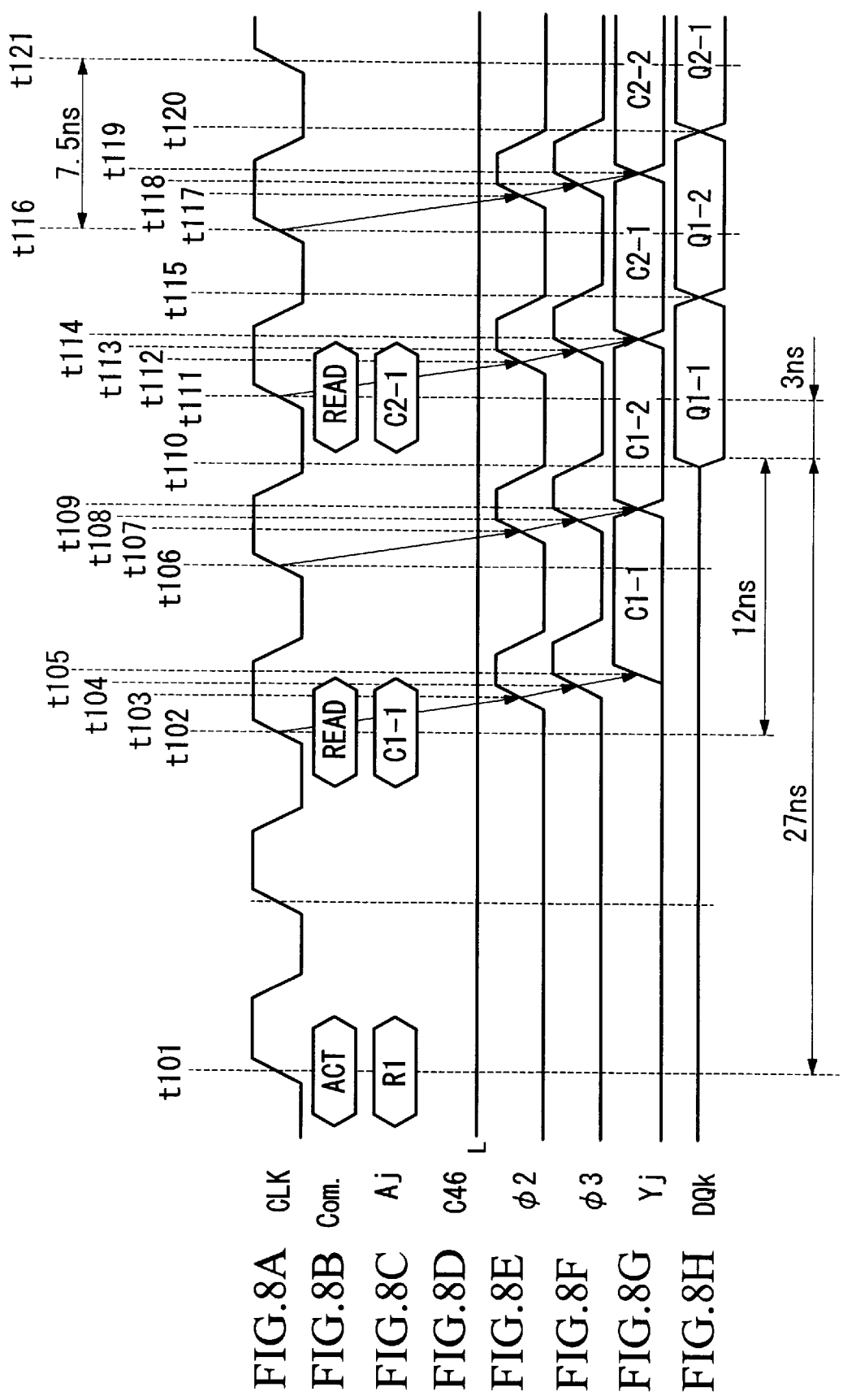

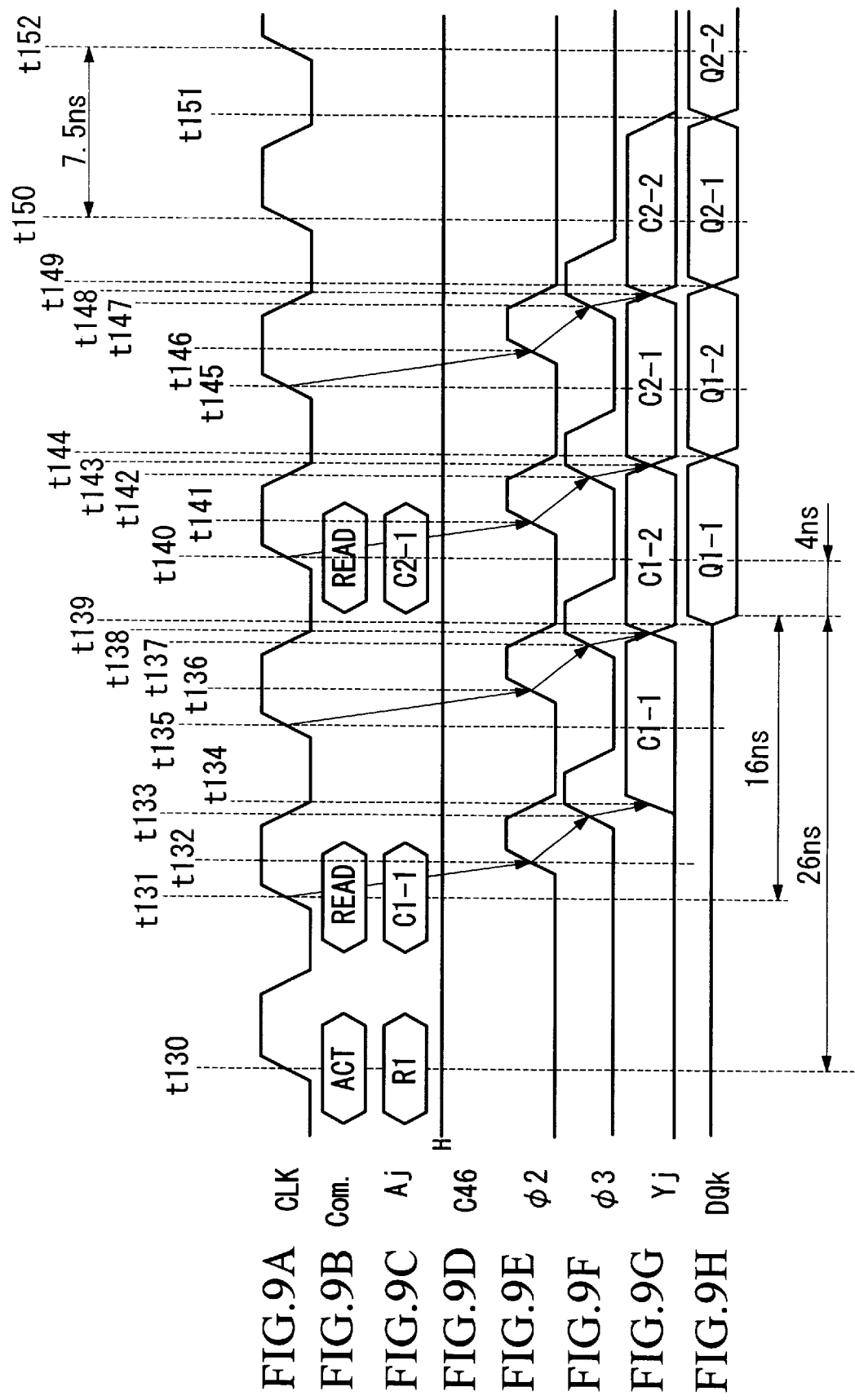

SYNCHRONOUS SEMICONDUCTOR STORAGE DEVICE

BACKGROUND OF THE INVENTION

1. Field of the Invention

This invention relates to synchronous semiconductor storage devices of an address multiplex type, which operate in synchronization with clock signals given from the external.

This application is based on Patent Application No. Hei 11-16273 filed in Japan, the content of which is incorporated herein by reference.

2. Description of the Related Art

In general, dynamic random-access memories (i.e., DRAMs) are normally used for main storage of computers and are continuously improved in high-speed performance. However, operating speeds of the DRAMs cannot catch up with operating speeds of microprocessors whose performance is improved more and more in these days. For this reason, access times and cycle times of the DRAMs bottleneck further improvement of computer systems. So, there is a problem in which performance of the computer systems as a whole should be reduced due to the access times and cycle times of the DRAMs. In these days, the computer systems tend to use synchronous DRAMs (or SDRAMs), which operate in synchronization with clock signals, as DRAMs applicable to the microprocessors which operate at high speeds. For example, Japanese Patent Application, Publication No. Hei 10-504129 (which corresponds to PCT International Publication No. WO 96/29637, hereinafter, simply referred to as a related art) discloses an example of a synchronous DRAM with programmable latency period.

FIG. 7 is a block diagram showing a configuration of a synchronous DRAM, which is designed in consideration of the aforementioned related art. As compared with an original configuration of the synchronous DRAM of the related art, the configuration of the synchronous DRAM of FIG. 7 is modified to cope with a configuration of the present invention, details of which will be described later. Incidentally, the specifics of the configuration of the synchronous DRAM will be described later in connection with embodiments of the present invention, so only the selected parts of FIG. 7 are discussed below in connection with problems.

FIGS. 8A–8H and FIGS. 9A–9H are time charts, which are used to show timings in read operations of the synchronous DRAM shown in FIG. 7. In those figures, signals and data corresponding to those shown in FIG. 7 are designated by same reference symbols and numerals. FIG. 7 shows a number of reference symbols such as "/CS" and "nACT", each of which is expressed using a symbol "/" or a character "n" as its top to represent a negative logic. That is, each signal or data having a negative logic is denoted by a reference symbol whose top corresponds to "/" or "n".

Specifically, FIGS. 8A, 9A show a clock signal CLK, which is given from the external (i.e., external system or device) of the synchronous DRAM. FIGS. 8B, 9B show commands "Com." which are given from the external to designate various instructions for the synchronous DRAM. FIGS. 8C, 9C show an address signal "Aj" (where j is an integer which is not less than 0) which is given from the external. FIGS. 8E, 9E show a control signal φ2, which is made valid every time a column address Yj (see FIGS. 8G, 9G) for accessing a memory cell array 22 consisting of rows and columns is generated. FIGS. 8F, 9F show a column address control signal φ3, which controls timing for instructing a column address buffer 18 to output the column address Yj to a column decoder 23. FIGS. 8D, 9D show a signal C46, which instructs the synchronous DRAM whether to directly output the control signal φ2 as the column address control signal φ3 or whether to generate the column address control signal φ3 by delaying the control signal φ2 by a predetermined time. FIGS. 8H, 9H show output data DQk which are read from the synchronous DRAM. At a write operation mode, data being input to the synchronous DRAM are given as the output data DQk. The commands Com. (see FIGS. 8B, 9B) contain a variety of commands such as "READ" and "ACT". Herein, "READ" designates a read command, which instructs the synchronous DRAM to perform a burst read operation from the memory cell array 22, while "ACT" designates an active command for activating a row whose address is designated by the address signal Aj.

In the aforementioned synchronous DRAM, a time by which output data appear as DQk after an active command ACT is counted using units of cycles of the clock signal CLK. So, a number of cycles corresponding to the above time is called "row address strobe (RAS) latency". In addition, a time by which output data appear as DQk after a read command READ is counted using units of cycles of the clock signal CLK. So, a number of cycles corresponding to the above time is called "column address strobe (CAS) latency". According to the specification of the synchronous DRAM, if CAS latency is "N" (where "N" is a natural number), its corresponding RAS latency is "2N". Because, a time by which a read command READ is ready to be applied after an active command ACT is applied to the synchronous DRAM is substantially identical to a time by which the synchronous DRAM outputs data after the read command READ. Incidentally, it is possible to further describe the aforementioned time corresponding to the RAS latency in detail, as follows:

An active command ACT is applied to the synchronous DRAM, so that a specific word line "Word" is selected. Then, data regarding the word line Word in the memory cell array 22 are amplified by a sense amplifier 24 and are ready to be read out. So, the time of the RAS latency is defined between the timing to apply the active command ACT and the timing that the data are ready to be read out.

In the following description, the time of the RAS latency is denoted by "tRCD", while the time of the CAS latency is denoted by "tAA". In addition, a time "tRAC" is defined as a sum of the above times, i.e., tRAC=tRCD+tAA.

Next, an outline operation of the synchronous DRAM within the time tRCD will be described below.

First, a row address Xj output from a row address buffer 17 is supplied to a row decoder 21 by way of a pre-decoder latch 20. The row decoder 21 decodes the row address Xj so as to activate any one of word lines (Word) on the memory cell array 22. Then, data regarding the activated word line Word corresponding to the row address Xj are input to a sense amplifier 24 in which the data are amplified.

Next, an outline operation of the synchronous DRAM within the time tAA after the time tRCD, will be described below.

A column address Yj output from a column address buffer 18 is decoded by a column decoder 23, so that a corresponding column switch (YSW) is activated (or turned on). As a result, data being activated by the column switch YSW, corresponding to the column address Yj, within the data being amplified by the sense amplifier 24 are supplied to a data amplifier 25 by way of a read bus Rbus, wherein the data are amplified. Then, the data are supplied to a data amplifier 28 by way of a data bus R/Wbus, wherein the data are further amplified. The data being amplified by the data amplifier 28 are transferred to a data latch 29 at a timing that a signal C27 is validated. Thereafter, when an output clock signal ICLKOE is validated, the data transferred to the data latch 29 are output as data DQk by way of an output buffer 30.

The performance of the synchronous DRAMs in mass production meet specification of tRCD=20 ns, tAA=16 ns (where "ns" denotes unit of nanosecond). Therefore, if a setup time of 4 ns is required for the system to which the synchronous DRAM is applied, it is possible to calculate the aforementioned latencies, under the condition where the clock signal CLK has a frequency of 100 MHz (i.e., clock cycle of 10 ns), as follows:

RAS latency=(20+16+4)/10=4

CAS latency=(16+4)/10=2

In addition, further improvement of performance is realized using the forefront process, by which some engineers (or manufacturer) develop high-performance products of synchronous DRAMs, which are capable of operating with the aforementioned latencies and with a higher clock frequency (CLK) of 133 MHz (i.e., clock cycle of approximately 7.5 ns). FIGS. 8A–8H show operation timings of the high-performance product of the synchronous DRAM, wherein tRAC=27 ns, tRCD=15 ns, tAA=12 ns. Herein, at time t101, an active command ACT and a row address R1 are applied to the synchronous DRAM. At time t102, a read command READ and a column address C1-1 are applied to the synchronous DRAM. Thereafter, at time t110 which is four cycles after the time t101(ACT), the synchronous DRAM outputs data Q1-1, designated by the row address R1 and column address C1-1, on the memory cell array 22. Hence, the RAS latency is "4". In addition, the synchronous DRAM outputs the data Q1-1 at the time t110 which is two cycles after the time t102(READ). Hence, the CAS latency is "2".

Another system whose clock frequency is lower than the aforementioned one (see FIGS. 8A–8H) is designed to optimize the time tAA by programming "small" CAS latency. For example, FIGS. 9A to 9H show operation timings of the synchronous DRAM, which is produced using the forgoing forefront process and which operates with the clock frequency of 100 MHz (i.e., clock cycle of 10 ns), wherein tRAC=26 ns, tAA=16 ns. In that case, it is optimal to employ the setting in which the RAS latency is set at "3" while the CAS latency is set at "2". However, such setting brings strict situation in which tRCD=10 ns, tAA=16 ns. That is, the time tAA may have a room in adjustment, however, the time tRCD is strictly restricted. This remarkably deteriorates speed derivative ratios.

In order to avoid problems described above, the aforementioned related art proposes a method in which when the time tRCD is a critical parameter, the time tAA is compensated with the time tRCD by delaying designation of the column address Yj. That is, in the case of FIGS. 8A–8H where the clock frequency (CLK) is 133 MHz, the RAS latency is "4", and the CAS latency is "2", the time tRCD is very long so that the burst control circuit 49 does not control the column address control signal φ3 to be delayed from the control signal φ2. For this reason, in the case of FIGS. 8A–8H, the column address control signal φ3 is output at time t104 just after time t103 when the control signal φ2 is generated. In contrast to the above, in the case of FIGS. 9A–9H where the RAS latency is "3" and the CAS latency is "2", the time tAA is compensated with the time tRCD. In this case, the synchronous DRAM uses a wait time delay circuit (not shown), equipped inside of the burst control circuit 49, to control the column address control signal φ3 to be delayed from the control signal φ2. Therefore, in the case of FIGS. 9A–9H, the column address control signal φ3 is output at time t133, which is delayed by a predetermined time from time t132 when the control signal φ2 is generated.

The aforementioned related art does not at all disclose any means or measures to change over activation and inactivation for the wait time delay circuit. Even if the related art employs the configuration of the synchronous DRAM shown in FIG. 7, the synchronous DRAM itself cannot make determination as to whether the column address control signal φ3 is delayed from the control signal φ2 or not. In order to make such determination, it is necessary to perform programming from the external of the synchronous DRAM. That is, the related art may be designed such that a mode register 46 is set with data (or commands) regarding determination as to whether the column address control signal φ3 is directly derived from the control signal φ2 or the column address control signal φ3 is created by delaying the control signal φ2. That is, the mode register 46 outputs a signal C46 to the burst control circuit 49. In accordance with the signal C46, the burst control circuit 49 determines whether to delay the control signal φ2 and generates the column address control signal φ3. Therefore, in the case of FIGS. 8A–8H, the signal C46 is fixed at a low level (or L level) (see FIG. 8D), so that the column address control signal φ3 is created without delaying the control signal φ2. In the case of FIGS. 9A–9H, the signal C46 is fixed at a high level (or H level), so that the column address control signal φ3 is created by delaying the control signal φ2.

As described above, the related art requests the system to perform the programming regarding the RAS latency, which is not originally included in the standard(s) of the synchronous DRAM in these days. In other words, the related art provides the synchronous DRAM with necessity that special standard is set to the synchronous DRAM from the external. In addition, the related art must determine clock frequencies in response to RAS latencies in advance respectively for first case where the time tRCD is sufficient and second case where the time tRCD is insufficient. So, it is necessary to set different delay times for the wait time delay circuit, provided inside of the burst control circuit 49, in response to differences between times tRCD and tAA. Further, in order to cope with a higher clock frequency which is higher than the foregoing clock frequencies in the foregoing cases of FIGS. 8A–8H and FIGS. 9A–9H and in which RAS latency is "5" and CAS latency is "3", for example, a ratio between times tRCD and tAA should differ from ratios of the foregoing cases. This inevitably makes the delay time to be different from the foregoing cases. In short, the related art lacks means (or device) for detecting a relationship between the times tRCD and tAA, so it is necessary to set a different delay time with respect to each latency. This makes designing of the synchronous DRAM to be complicated.

In general, the time tRCD has several dependencies such as process dependency, source voltage dependency and temperature dependency. Hence, in the simulation which is effected when designing the RAS latency and CAS latency, it is necessary to consider various parameters containing the temperature coefficient of the time tRCD. If the time tRCD is reduced from two cycles (see FIGS. 8A–8H) to one cycle (see FIGS. 9A–9H), the related art may design the delay time based on a time of "tRCD—(one clock cycle)". It may be relatively easy to set the same temperature coefficient of the time tRCD with respect to the delay time. However, it is difficult to set the temperature coefficient in response to the time, which is calculated by subtracting a fixed time of one clock cycle from the time tRCD. This causes an extra time being required for the simulation. In addition, it is difficult to perform the simulation with good accuracy.

SUMMARY OF THE INVENTION

It is an object of the invention to provide a synchronous semiconductor storage device, which does not require the system to perform programming of RAS latencies, which is not included in existing standards.

It is another object of the invention to provide a synchronous semiconductor storage device, in which it is unnecessary to design a delay time with respect to each latency.

It is a further object of the invention to provide a synchronous semiconductor storage device, which is capable of obtaining optimization in designing such that operation margins are minimized by setting substantially same process characteristic, source voltage characteristic and temperature characteristic for measured time of tRCD being measured between time of activation (ACT) and time of sense completion.

A synchronous semiconductor storage device (e.g., synchronous DRAM) contains a memory cell array consisting of memory cells, which are arranged in a matrix form in accordance with rows and columns. The memory cell array is accessed using row addresses and column addresses, which are made in synchronization with cycles of a clock signal being given from the external. When an active command (ACT) is applied to the synchronous semiconductor storage device, a row address is designated so that a corresponding row of the memory cell array is activated. In addition, a column address is designated in response to a read command (READ), so that a specific memory cell is designated to enable a read operation. Read operations are controlled in response to control signals, each of which consists of pulses which are produced in synchronization with the cycles of the clock signal. Herein, a first control signal ($\phi$2) is produced after a lapse of a predetermined delay time (tRCD), which elapses from the timing of the active command. The delay time corresponds to row address strobe (RAS) latency. A second control signal ($\phi$2) is produced after the timing of the read command. In addition, a third control signal ($\phi$3) consisting of pulses is produced based on either the first control signal or second control signal which is delayed.

When a gap occurs in read operations so that the second control signal is delayed from the first control signal under the condition where the third control signal is produced from the first control signal, a basis for creation of the third control signal is automatically changed over from the first control signal to the second control signal, so that the third control signal is to be produced from the second control signal. Incidentally, production of the first control signal is stopped in a period of time in which the third control signal is produced from the second control signal.

BRIEF DESCRIPTION OF THE DRAWINGS

These and other objects, aspects and embodiments of the present invention will be described in more detail with reference to the following drawing figures, of which:

FIG. 8A is a time chart showing a clock signal CLK under the first condition where RAS latency is "4", and CAS latency is "2";

FIG. 8B is a time chart showing commands Com. in connection with the first condition;

FIG. 8C is a time chart showing an address signal Aj in connection with the first condition;

FIG. 8D is a time chart showing a signal C46 in connection with the first condition;

FIG. 8E is a time chart showing a control signal φ2 in connection with the first condition;

FIG. 8F is a time chart showing a column address control signal φ3 in connection with the first condition;

FIG. 8G is a time chart showing a column address signal Yj in connection with the first condition;

FIG. 8H is a time chart showing data DQk in connection with the first condition;

FIG. 9A is a time chart showing a clock signal CLK under the second condition where RAS latency is "3", and CAS latency is "2";

FIG. 9B is a time chart showing commands Com. in connection with the second condition;

FIG. 9C is a time chart showing an address signal Aj in connection with the second condition;

FIG. 9D is a time chart showing a signal C46 in connection with the second condition;

FIG. 9E is a time chart showing a control signal φ2 in connection with the second condition;

FIG. 9F is a time chart showing a column address control signal φ3 in connection with the second condition;

FIG. 9G is a time chart showing a column address signal Yj in connection with the second condition; and FIG. 9H is a time chart showing data DQk in connection with the second condition.

DESCRIPTION OF THE PREFERRED EMBODIMENTS

This invention will be described in further detail by way of examples with reference to the accompanying drawings.

In the following description, preferred embodiments of this invention refer to a synchronous DRAM as an example of the semiconductor storage device.

[A] Embodiment 1

Figure 1:
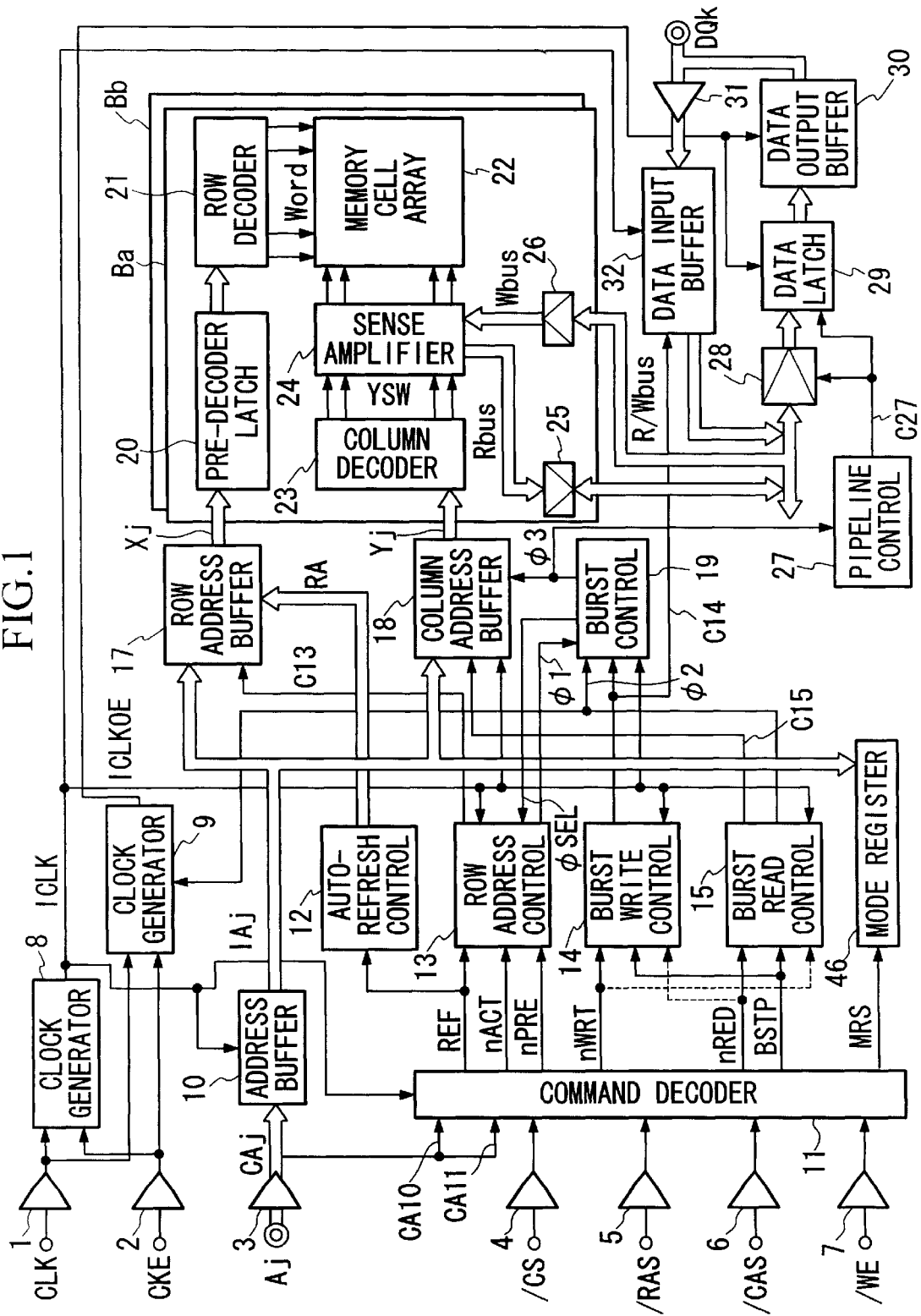
FIG. 1 is a block diagram showing a configuration of a synchronous DRAM in accordance with embodiment 1 of the invention.
Figure 7:
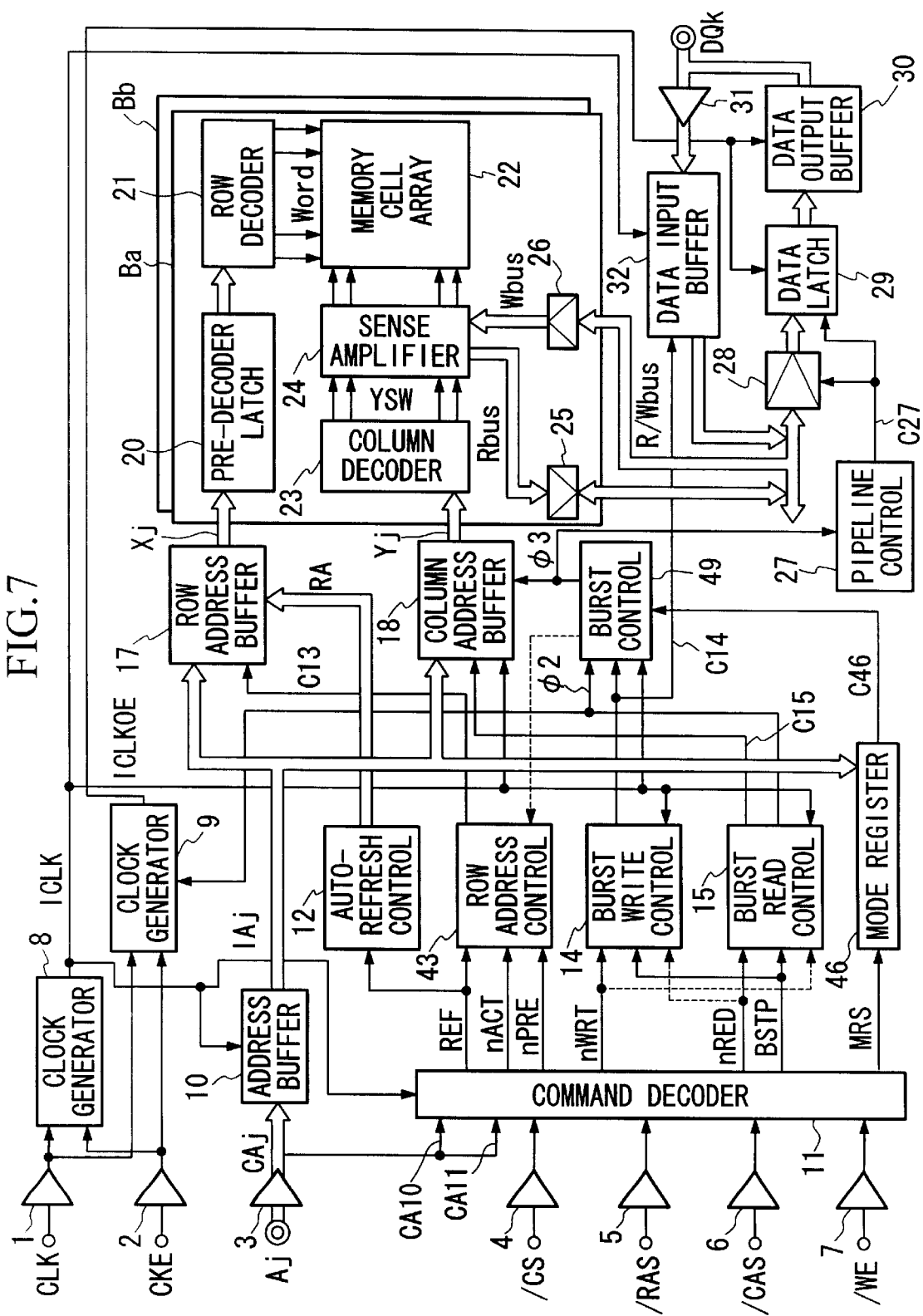
FIG. 7 is a block diagram showing a configuration of a synchronous DRAM, which is designed in consideration of the related art.

FIG. 1 is a block diagram showing a configuration of a synchronous DRAM in accordance with embodiment 1 of the invention, wherein parts, signals and data equivalent to those shown in FIG. 7 are designated by the same reference symbols and numerals.

In FIG. 1, a reference symbol "CLK" designates a system clock signal, which is one of input signals being given from the external of the synchronous DRAM. The input signals synchronize with timings of pulses of the system clock signal CLK. In addition, a clock enable signal CKE is provided in response to the system clock signal CLK. An address signal Aj representing an address is supplied to the synchronous DRAM from the external. Using the address signal Aj, row addresses, column addresses and the like are input to the synchronous DRAM in a time-division manner. A part of bits of the address Aj is used for selecting a memory bank and/or is used for precharge control. A reference symbol /CS designates a chip select signal. When the chip select signal /CS is placed in a low level (or L level), a command input cycle is started. Further, the synchronous DRAM inputs a row address strobe signal /RAS, a column address strobe signal /CAS and a write enable signal /WE. Details of those signals will be described later according to needs.

Gates 1 to 7 are provided to shape and output the aforementioned input signals of the synchronous DRAM. FIG. 1 shows only one gate "3". Actually, however, there are provided a number of gates "3", which matches with a number of addresses (Aj). The gate 3 shapes the address Aj to output an address CAj. In accordance with the system clock signal CLK and the clock enable signal CKE, a clock generator 8 generates an internal clock signal ICLK, which is delivered to some parts and components of the synchronous DRAM. A clock generator 9 generates an output clock signal ICLKOE based on the system clock signal CLK and the clock enable signal CKE as well as a control signal φ2 output from a burst read control circuit 15, details of which will be described later. The output clock signal ICLKOE is used to activate a data latch 29 and a data output buffer 30, which will be described later. In synchronization with the internal clock signal ICKL, an address buffer 10 inputs the address CAj being output from the gate 3 to output an address IAj, which is an internal address for the synchronous DRAM.

A command decoder 11 decodes commands, which are determined in advance in response to levels of the foregoing input signals /CS, /RAS, /CAS and /WE as well as combinations of addresses CA10, CA11 within the address CAj. So, the command decoder 11 outputs signals which respectively correspond to the commands. That is, the command decoder 11 outputs a signal REF corresponding to an auto-refresh command, a signal nACT corresponding to the foregoing active command, and a signal nPRE corresponding to a precharge command to start a precharge operation on a specific memory bank. In addition, the command decoder 11 also outputs signals nWRT, nRED, BSTP and MRS. Herein, the signal nWRT corresponds to a write command that instructs the synchronous DRAM to start a write operation from a burst start address designated by a column address, while the signal nRED corresponds to a read command (also corresponding to the foregoing read command READ) that instructs the synchronous DRAM to start a read operation of data from the burst start address designated by the column address. The signal BSTP corresponds to a burst stop command that stops a burst operation during execution. The signal MRS is validated when each of mode register setting commands is designated. Herein, the mode register setting commands are used to set modes for a mode register 16, which will be described later.

When the signal REF is validated, an auto-refresh control circuit 12 automatically produces a refresh address RA therein. The auto-refresh control circuit 12 supplies the refresh address RA to a row address buffer 17 to execute an auto-refresh operation. A row address control circuit 13 produces a control signal φ1 to be forwarded to a burst control circuit 19 on the basis of the aforementioned signals REF, nACT, nPRE and the internal clock signal ICLK as well as a selecting signal φSEL. In addition, the row address control circuit 13 also produces a control signal C13 to control operation of the row address buffer 17, which will be described later. No effective method is provided for directly and accurately measuring a period of time required for sense completion, in which a word line is selected by an active command ACT so that data of the memory cell array 22 are amplified by the sense amplifier 24 and are ready to be read out. For this reason, the row address control circuit 13 is designed to produce the control signal φ1 after a predetermined delay time corresponding to the time tRCD elapses from a reference time corresponding to input timing of the active command ACT. Once the row address control circuit 13 starts production of the control signal φ1, pulses are sequentially produced as the control signal φ1 by cycles of the system clock signal CLK until the selecting signal φSEL is placed in an L level. To obtain the delay time, the row address control circuit 13 incorporates a wait time delay circuit, which is similar to one being described in connection with the related art. When the burst control circuit 19 sends an L level signal as the selecting signal φ SEL to the row address control circuit 13, the row address control circuit 13 stops producing the control signal φ1. Incidentally, relationships between the control signals φ1, φ2 and the column address control signal φ3 will be described later.

A burst write control circuit 14 produces a control signal C14 based on the signals nWRT, nRED, BSTP and the internal clock signal ICLK. The control signal C14 controls the synchronous DRAM to perform burst write operations on the memory cell array 22. Similarly, a burst read control circuit 15 produces a control signal C15 and the control signal φ2 based on the signals nWRT, nRED, BSTP and the internal clock signal ICLK. Those signals control the synchronous DRAM to perform burst read operations on the memory cell array 22. The mode register 16 inputs mode designation data on the address IAj when the command decoder 11 outputs the signal MRS. Internal parts and components of the synchronous DRAM perform operations in response to a mode, which is set by the mode register 16. To avoid complication in illustration, FIG. 1 does not specifically show connections between the mode register 16 and internal parts of the synchronous DRAM. In accordance with the control signal C13 output from the row address control circuit 13, the row address buffer 17 inputs the address IAj or the refresh address RA, which is output therefrom as a row address Xj.

Figure 2:
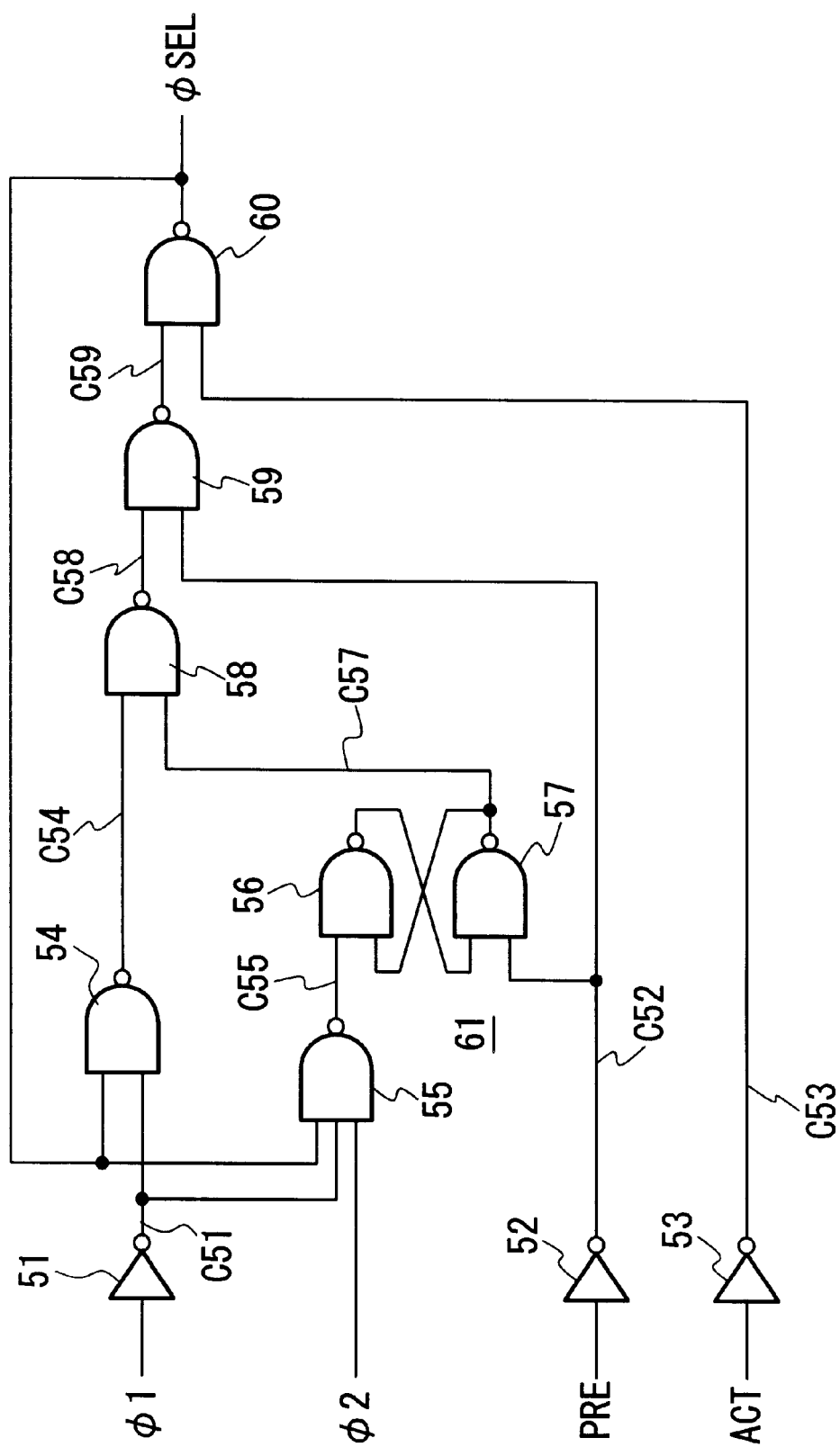
FIG. 2 is a circuit diagram showing a configuration of an internal logic circuit of a burst control circuit shown in FIG. 1.
Figure 3:
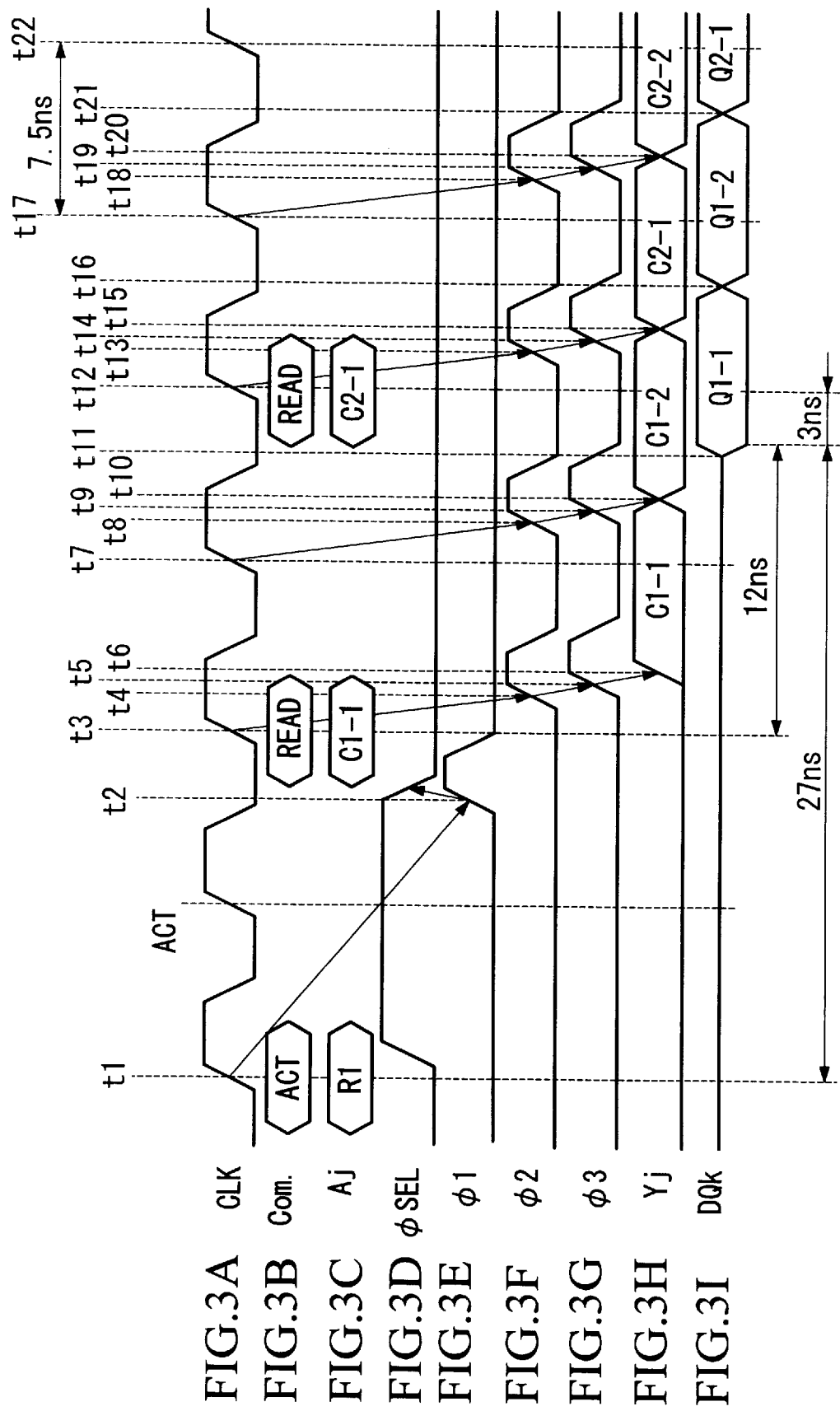
FIG. 3A is a time chart showing a clock signal CLK under a first condition where RAS latency is "4", and CAS latency is "2" in the embodiment 1.
FIG. 3B is a time chart showing commands Com. in connection with the first condition.
FIG. 3C is a time chart showing an address signal Aj in connection with the first condition.
FIG. 3D is a time chart showing a selecting signal $\phi$SEL in connection with the first condition.
FIG. 3E is a time chart showing a control signal $\phi$1 in connection with the first condition.
FIG. 3F is a time chart showing a control signal $\phi$2 in connection with the first condition.
FIG. 3G is a time chart showing a column address control signal $\phi$3 in connection with the first condition.
FIG. 3H is a time chart showing a column address Yj in connection with the first condition.
FIG. 3I is a time chart showing data DQk in connection with the first condition.

Upon receipt of a read command or a write command, a column address buffer 18 inputs a column address on the address IAj in accordance with the control signal C15. At the timing of the column address control signal φ3 produced by the burst control circuit 19, the column address buffer 18 outputs a column address being previously input thereto as a column address Yj. In addition, the column address buffer 18 produces a column address for next access on the basis of the column address being input in advance. The burst control circuit 19 produces the selecting signal φSEL and the column address control signal φ3 based on the control signals φ1, φ2 and C14 as well as the internal clock signal ICLK. In the present embodiment, the burst control circuit 19 produces the column address control circuit φ3 by one of the control signals φ1, φ2, which is delayed. To select one of them, the burst control circuit 19 produces the selecting signal φSEL. FIG. 2 is a block diagram showing a configuration of an internal circuit, which is provided inside of the burst control circuit 19 to produce the selecting signal φSEL. That is, when the selecting signal φSEL is in a high level (or H level), the burst control circuit 19 selects the control signal φ1 to produce the column address control circuit φ3. When the selecting signal φSEL is in a low level (or L level), the burst control circuit 19 selects the control signal φ2 to produce the column address control signal φ3. Herein, when the burst control circuit 19 determines to select the control signal φ2, the burst control circuit 19 reduces the selecting signal φSEL in level to the L level, so that the row address control circuit 13 stops producing the control signal φ1. Incidentally, details of selection logic shown in FIG. 2 will be described later after describing operations of the synchronous DRAM.

In FIG. 1, reference symbols Ba, Bb designate memory banks. That is, FIG. 1 shows an example of the synchronous DRAM, which is equipped with two memory banks Ba, Bb, wherein an internal configuration of the memory bank Ba is shown in detail. In the memory bank Ba, for example, a pre-decoder latch 20 latches the row address Xj output from the row address buffer 17. In addition, the pre-decoder latch 20 makes a decision, based on designation of the memory bank included in the row address Xj, as to whether the present memory bank itself is selected or not. When the pre-decoder latch 20 determines that the present memory bank (e.g., Ba) itself is selected, a row decoder 21 activates one of word lines (Word) of the memory cell array 22 in accordance with the row address output from the pre-decoder latch 20. In accordance with the column address Yj output from the column address buffer 18, a column decoder 23 activates one of column switches YSW, which are provided with respect to columns of the memory cell array 22 respectively. A sense amplifier 24 inputs and amplifies data on the word line Word being activated by the row decoder 21. Then, the sense amplifier 24 reads data corresponding to the activated column switch YSW within the data on the word line Word so as to send it out onto a bus Rbus.

A data amplifier 25 amplifies the data being read out on the bus Rbus in conformity with a prescribed level of a bus R/Wbus. So, the data amplifier 25 sends the data out onto the bus R/Wbus, which is commonly shared by the memory banks. A write amplifier 26 converts data on the bus R/Wbus in conformity with a level of a bus Wbus. Then, the write amplifier 26 outputs the data to the sense amplifier 24, so that the data are written into a cell of the memory cell array 22. A pipeline control circuit 27 manages pipeline operations, inside of the synchronous DRAM, which are needed to perform burst read operations (or burst write operations). In accordance with the column address control signal φ3, the pipeline control circuit 27 determines data output timing, by which data are output from the data amplifier 25. That is, the pipeline control circuit 27 produces a control signal C27 to designate the data output timing. A data amplifier 28 inputs data signals being output on the bus R/Wbus in accordance with the control signal C27. The data amplifier 28 amplifies the data signals in conformity with an input level of a data latch 29. Thus, the data signals are supplied to the data latch 29. The data latch 29 inputs the data signals output from the data amplifier 28 in accordance with the control signal C27 and the output clock signal ICLKOE. The data latch 29 transfers the data signals to a data output buffer 30. So, the data signals output from the data latch 29 are subjected to buffering in the data output buffer 30 in accordance with the output clock signal ICLKOE. An output of the data output buffer 30 is provided as data DQk (where k is an integer not less than 0), which is output to the external from the synchronous DRAM. Next, a gate 31 shapes data signals being input thereto as the data DQk. The data signals output from the gate 31 are supplied to a data input buffer 32. Herein, the input data signals are subjected to buffering in the data input buffer 32. Then, the data input buffer 32 sends the input data signals to the write amplifier 26 by way of the bus R/Wbus in accordance with the control signal C14 and the internal clock signal ICLK.

Next, overall operations of the synchronous DRAM of FIG. 1 will be described in detail with reference to FIGS. 3A–3I and FIGS. 4A–4I. Herein, FIGS. 3A–3I are drawn under the same conditions of FIGS. 8A–8H, wherein the clock frequency (CLK) is set at 133 MHz so that the RAS latency is "4", and the CAS latency is "2". FIGS. 4A–4I are drawn under the same conditions of FIGS. 9A–9H, wherein the clock frequency (CLK) is set at 100 MHz so that the RAS latency is "3", and the CAS latency is "2". In the following description, the overall operation of the synchronous DRAM will be described first with reference to FIGS. 3A to 3I, then, the overall operation of the synchronous DRAM will be described with reference to FIGS. 4A to 4I.

At time t1, an activation command ACT (see FIG. 3B) is applied to the synchronous DRAM in synchronization with a leading edge of a pulse of the clock signal CLK, so that a signal nACT is validated. At this time, the synchronous DRAM is given an address Aj, which represents a value (i.e., R1, see FIG. 3C) of a row address corresponding to a row of the memory cell array 22 to be activated in connection with the active command ACT. Because the command decoder 11 validates the signal nACT, the row address control circuit 13 produces a control signal C13, which instructs the row address buffer 17 to input an address IAj output from the address buffer 10. That is, the row address buffer 17 inputs the aforementioned value R1 of the row address from the address IAj. This value is supplied to the pre-decoder latch 20 as a row address Xj. Thus, the row decoder 21 provided on the memory bank (e.g., Ba) designated by the row address Xi activates a word line (Word) corresponding to the row address output from the pre-decoder latch 20. In response to the active command ACT, the burst control circuit 19 changes over a selecting signal φSEL to have a H level, so that the burst control circuit 19 changes over a mode of the internal circuit thereof to produce a column address control signal φ3 from a control signal φ1.

At time t2 at which the fixed time tRCD elapses from the time t1 when the active command ACT is applied to the synchronous DRAM, the row address control circuit 13 temporarily changes over the control signal φ1 to have a H level. Herein, the H level of the control signal φ1 substantially represents sense completion. In this case, however, a read command READ has not been applied to the synchronous DRAM yet at the timing at which the control signal φ1 is set at the H level, so that the burst read control circuit 15 does not produce a control signal φ2. Under the present circumstance, the burst control circuit 19 regards that the time tRCD is sufficiently long and determines that the column address control signal φ3 is produced from the control signal φ2, so that the burst control circuit 19 changes over the selecting signal φSEL to have an L level. The burst control circuit 19 outputs the selecting signal φSEL to the row address control circuit 13, so that the row address control circuit 13 stops producing the control signal φ1. This reduces an amount of electric current being consumed by the wait time delay circuit.

At time t3, a read command READ is applied to the synchronous DRAM in synchronization with a leading edge of a pulse of the clock signal CLK, so that a signal nRED is validated. At the same time, the address Aj is given a value (i.e., C1-1, see FIG. 3C) of a column address corresponding to a column of the memory cell array 22 to be selected. Thus, the column address buffer 18 inputs the value of the column address, corresponding to the address IAj output from the address buffer 10, in accordance with a control signal C15, which is output from the burst read control circuit 15. In response to the read command READ, the burst read control circuit 15 changes over the control signal φ2 thereof to have a H level at time t4. At this time, the burst control circuit 19 determines to produce the column address control signal φ3 from the control signal φ2. So, at time t5 which comes after the time t4 by a delay of a logic circuit of FIG. 2, the burst control circuit 19 temporarily changes over the column address control signal φ3 to have a H level. At time t6, the column address buffer 18 outputs the column address C1-1, which has been input thereto at time t3. The column address C1-1 is supplied to the column decoder 23 as a column address Yj. As a result, the column decoder 23 activates a column switch YSW corresponding to the column address C1-1.

Thereafter, the synchronous DRAM performs burst read operations. At time t7, the burst read control circuit 15 outputs a control signal C15 in response to a leading edge of a pulse of the clock signal CLK. Thus, the burst read control circuit 15 produces a next value C1-2 of the column address in accordance with the control signal C15. At time t8, the burst read control circuit 15 produces a pulse of the control signal φ2. At time t9, the burst control circuit 19 produces a pulse of the control signal φ3. At time t10, the column address buffer 18 outputs the column address C1-2 as the column address Yj. Thereafter, at time t11, the sense amplifier 24 outputs data (i.e., Q1-1, see FIG. 3I) of a memory cell, which is specified by the row address R1 and the column address C1-1. The data pass through the bus Rbus and are then output onto the bus R/Wbus from the data amplifier 25. At this time, the pipeline control circuit 27 validates a control signal C27 thereof in accordance with the column address control signal φ3, which the burst control circuit 19 produces at the time t4. In accordance with the control signal C27, the data Q1-1 on the bus R/Wbus are forwarded to the data latch 29 by way of the data amplifier 28. Thereafter, the clock generator 9 validates the output clock signal ICLKOE based on the system clock signal CLK and the clock enable signal CKE, so that the data input to the data latch 29 are output to the external from the data output buffer 30 as data DQk.

Thereafter, the aforementioned operations being performed between the times t3 to t11 are similarly repeated. That is, at time t12, a next read command READ designating a new column address C2-1 (see FIG. 3C) is applied to the synchronous DRAM. At time t13, the burst read control circuit 15 produces a pulse of the control signal φ2. In accordance with the control signal φ2, the burst control circuit 19 produces a pulse of the control signal φ3 at time t14. At time t15, the column address buffer 18 outputs the column address C2-1 as the column address Yj (see FIG. 3H). At time t16, data Q1-2 corresponding to the column address C1-2 are output as data DQk (see FIG. 3I). Thereafter, at time t17, the column address buffer 18 produces a column address C2-2 following the column address C2-1 therein. In addition, the burst read control circuit 15 produces a pulse of the control signal φ2 at time t18, then, the burst control circuit 19 produces a pulse of the column address control signal φ3 at time t19. At time 20, the column address buffer 18 outputs the column address C2-2 as the column address Yj (see FIG. 3H). At time t21, data Q2-1 corresponding to the column address C2-1 are output as data DQk (see FIG. 3I).

As described above, in the operation mode of FIGS. 3A–3I where (RAS latency)=(CAS latency)×2, the synchronous DRAM operates as follows:

The control signal φ1 is detected prior to the control signal φ2. At the timing that the control signal φ1 is produced, the burst control circuit 19 changes over the selecting signal φSEL to have the L level, so that the row address control circuit 13 stops producing the control signal φ1. Thereafter, pulses of the column address control signal φ3 are sequentially produced in synchronization with pulses of the control signal φ2.

Next, overall operation of the synchronous DRAM will be described with reference to FIGS. 4A–4I. At time t31, an active command ACT designating a row address R1 (see FIGS. 4B, 4C) is applied to the synchronous DRAM. The burst control circuit 19 changes over a selecting signal φSEL (see FIG. 4D) to have a H level in synchronization with the active command ACT, so that the burst control circuit 19 is subjected to initial setting in which a column address control signal φ3 is to be produced from a control signal φ1. At time t32, a read command READ designating a column address C1-1 is applied to the synchronous DRAM. At time t33, the burst read control circuit 15 produces a control signal φ2 (see FIG. 4F). At the time t33 when the burst read control circuit 15 produces the control signal φ2, the time tRCD has not been passed from the time t31, so that the synchronous DRAM has not been placed in a state of sense completion. That is, the row address control circuit 13 does not yet produce the control signal φ1 in a period of time between the times t31 to t33. For this reason, it is necessary to delay production of a column address Yj until the synchronous DRAM is placed in the state of sense completion. In order to do so, the burst control circuit 19 retains the selecting signal φSEL to be at the H level, by which the internal circuit thereof is retained in an initial state where the column address control signal φ3 is to be produced from the control signal φ1.

Figure 4:
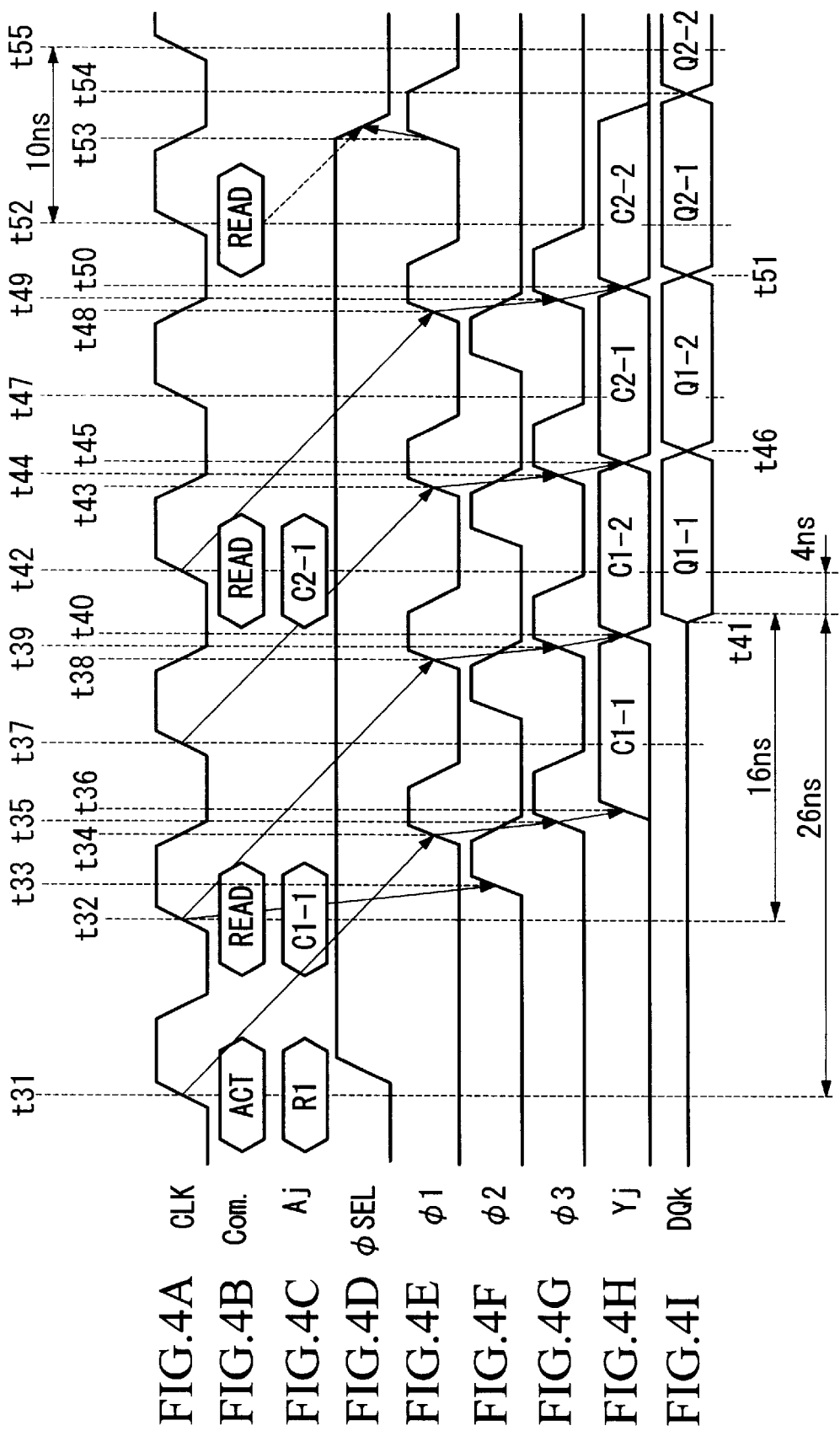
FIG. 4A is a time chart showing a clock signal CLK under a second condition where RAS latency is "4", and CAS latency is "2" in the embodiment 1.
FIG. 4B is a time chart showing commands Com. in connection with the second condition.
FIG. 4C is a time chart showing an address signal Aj in connection with the second condition.
FIG. 4D is a time chart showing a selecting signal $\phi$ SEL in connection with the second condition.
FIG. 4E is a time chart showing a control signal $\phi$1 in connection with the second condition.
FIG. 4F is a time chart showing a control signal $\phi$2 in connection with the second condition.
FIG. 4G is a time chart showing a column address control signal $\phi$3 in connection with the second condition.
FIG. 4H is a time chart showing a column address Yj in connection with the second condition.
FIG. 4I is a time chart showing data DQk in connection with the second condition.

At time t34 at which the fixed time tRCD elapses from the time t31, the row address control circuit 13 produces the control signal φ1 (see FIG. 4E). At time t35 after a lapse of the delay of the logic circuit of FIG. 2, the burst control circuit 19 produces the column address control signal φ3 (see FIG. 4G) from the control signal φ1. Due to production of the column address control signal φ3, the column address buffer 18 outputs the column address C1-1 as the column address Yj (see FIG. 4H) at time t36. Then, at time t37 corresponding to a leading edge of a pulse of the system clock signal CLK, the column address buffer 18 produces a column address C1-2 following the column address C1-1 therein. Next, at time t38 at which the time tRCD elapses from the time t32 corresponding to a leading edge of a pulse of the system clock signal CLK, the row address control circuit 13 produces a pulse of the control signal φ1 again. At time t39, the burst control circuit 19 produces a pulse of the column address control signal φ3 from the pulse of the control signal φ1. Then, at time t40, the column address buffer 18 outputs the column address C1-2 as the column address Yj. At time t41, the data output buffer 30 outputs data Q1-1 corresponding to the column address C1-1 as data DQk (see FIG. 4I).

Thereafter, the aforementioned operations are similarly repeated. That is, at time t42, a read command READ designating a column address C2-1 is applied to the synchronous DRAM. In response to a leading edge of a pulse of the system clock signal CLK at time t37, the row address control circuit 13 produces a pulse of the control signal φ1 at time t43. At time t44, the burst control circuit 19 produces a pulse of the control signal φ3 from the pulse of the control signal φ1. At time t45, the column address buffer 18 outputs the column address Yj corresponding to the column address C2-1, which is given at the time t42. At time t46, the data output buffer 30 outputs data Q1-2 corresponding to the column address C1-2 as the data DQk. Then, at time t47, the column address buffer 18 produces a column address C2-2 following the column address C2-1 therein. In response to a leading edge of a pulse of the system clock signal CLK at the time t42, the row address control circuit 13 produces a pulse of the control signal φ1 at time t48. At time t49, the burst control circuit 19 produces a pulse of the column address control signal φ3 from the pulse of the control signal φ1. At time t50, the column address buffer 18 outputs the column address Yj corresponding to the column address C2-2, which is created at the time t47. At time t51, the data output buffer 30 outputs data Q2-1 corresponding to the column address C2-1 as the data DQk.

At time t52, a precharge command PRE is applied to the synchronous DRAM so that a signal nPRE is validated. At time t53, the burst control circuit 19 changes over the selecting signal φSEL to have an L level. This selecting signal φSEL is supplied to the row address control circuit 13. Thus, the row address control circuit 13 stops producing the control signal φ1 so that an amount of electric current being consumed is reduced. Thereafter, at time t54, the data output buffer 30 outputs data Q2-2 corresponding to the column address C2-2 as the data DQk. Thus, the synchronous DRAM completes a series of burst read operations.

In the aforementioned operation mode of FIGS. 4A–4I where (RAS latency)<(CAS latency)×2, the synchronous DRAM operates as follows:

The control signal φ2 is detected prior to the control signal φ1. For this reason, the burst control circuit 19 produces the column address control signal φ3 in accordance with the control signal φ1, which is produced after a lapse of the time tRCD from the timing of the active command ACT. With respect to column addresses which are sequentially designated, pulses of the control signal φ1 are sequentially produced at timings, each of which is delayed from each of leading edges of pulses of the system clock signal CLK following the active command by the time tRCD.

Next, the logic circuit of FIG. 2 that produces the selecting signal φSEL will be described in detail. In FIG. 2, reference numerals 51 to 53 designate inverters, and reference numerals 54 to 60 designate NAND gates. Herein, the NAND dates 56, 57 are connected together to form a flip-flop circuit 61. In addition, a reference symbol "PRE" designates an inverted signal of the foregoing signal nPRE, and a reference symbol "ACT" designates an inverted signal of the foregoing signal nACT. Now, concrete operations of the logic circuit of FIG. 2 will be described with reference to FIGS. 3A–3I. FIGS. 3A–3I do not always show specifics in operations of the logic circuit of FIG. 2, wherein the signal PRE is applied to the logic circuit to perform a precharge operation before the signal ACT to be applied. When the signal PRE having a H level is applied to the logic circuit of FIG. 2, the inverter 52 correspondingly outputs a signal C52 having an L level, so that the NAND gate 59 outputs a signal C59 having a H level. At this time, the signal ACT having a H level is not applied to the logic circuit, so that the inverter 53 outputs a signal C53 having a H level. Because both of the signals C53, C59 being input to the NAND gate 60 have the H level, the NAND gate 60 outputs a selecting signal φSEL, which is initially set at an L level. Because the signal C52 has the L level, the flip-flop 61 is placed in a "set" state, so that the flip-flop 61 outputs a signal C57, which is set at a H level.

Next, at time t1 when the signal ACT is set at a H level because the active command ACT is applied to the synchronous DRAM, the signal C53 output from the inverter 53 is placed in an L level. As a result, the logic circuit changes over the selecting signal φSEL to have a H level, so that the control signal φ1 is to be selected. At time t2 when the row address control circuit 13 produces the control signal φ1 having a H level, the inverter 51 correspondingly outputs a signal C51 which is at an L level, so that the NAND gate 54 outputs a signal C54 having a H level. Because the signal C51 is set at the L level, the NAND gate 55 outputs a signal C55 having a H level. At this time, the signal PRE having a H level is not applied to the logic circuit, so that the inverter 52 outputs a signal C52 having a H level. Because both of the signals C52, C55 have the H level, the flip-flop 61 is not changed in state thereof, so that the flip-flop 61 retains the signal C57 having the H level, while a signal C58 output from the NAND gate 58 is set at an L level. As a result, the NAND gate 59 outputs a signal C59 having a H level. At this time, the signal ACT having a H level is not applied to the logic circuit, so that the inverter 53 outputs the signal C53 having the H level. Hence, the logic circuit changes over the selecting signal φSEL to have an L level, so that the control signal φ2 is to be selected. Then, at time t4, the control signal φ2 is changed in level to have a H level. In this case, however, the selecting signal φSEL is set at the L level, so that the NAND gate 54 retains the signal C54 to have the H level, while the NAND gate 55 retains the signal C55 to have the H level, regardless of the H level of the control signal φ2. As a result, the logic circuit of FIG. 2 is not changed in state to retain the selecting signal φSEL at the L level, regardless of a level change of the control signal φ2. Thereafter, the aforementioned operations are similarly repeated, so that the selecting signal φSEL is retained at the L level, regardless of level changes of the control signal φ2.

Next, concrete operations of the logic circuit of FIG. 2 will be described in detail with reference to FIGS. 4A–4I. Herein, the aforementioned operations which are described before with reference to FIGS. 3A–3I are similarly performed by the logic circuit until a level change of the control signal φ2 to have a H level at time t33, as follows:

That is, a signal PRE is applied to the logic circuit before a signal ACT is applied to the logic circuit, so a selecting signal φSEL is initialized at an L level, while the inverter 52 outputs a signal C52 having an L level. Thus, the flip-flop 61 is placed in a "set" state so that the signal C57 is set at a H level. At time t31 when the signal ACT is applied to the logic circuit, the inverter 53 correspondingly outputs a signal C53 having an L level, so that the selecting signal φSEL is changed to have a H level. At time t33, the burst read control circuit 15 changes over a control signal φ2 to have a H level. At this time, a control signal φ1 is set at an L level, so the inverter 51 outputs a signal C51 having a H level. In addition, the selecting signal φSEL is set at the H level, so a signal C55 output from the NAND gate 55 is set at an L level. In this case, the signal PRE is not applied to the logic circuit, so the inverter 52 outputs a signal C52 having a H level. Because of the reasons described above, when the signal C55 is set at the L level, the flip-flop 61 is reset, so that the signal C57 is placed at an L level. Thus, a signal C58 of the NAND gate 58 is set at a H level. So, all of the signals C52, C53 and C58 have the H level. For this reason, the logic circuit retains the selecting signal φSEL to have the H level.

Thereafter, at time t34 when the control signal φ1 is set at a H level, the signal C51 is set at an L level, while the signals C54, C55 are both set at a H level. At this time, the signal PRE is not applied to the logic circuit, so the flip-flop 61 is not changed in state thereof so that the signal C57 remains at the L level. Hence, the signal C58 is at a H level. In this case, both of the signals C52, C53 are at the H level, so the selecting signal φSEL remains at the H level. Thereafter, the aforementioned operations are similarly repeated until time t52. At time t52 when the signal PRE having a H level is applied to the logic circuit, the inverter 52 outputs a signal C52 having an L level, so that the flip-flop 61 is placed in a "set" state to change over the signal C57 to have a H level. Because the signal C52 is set at the L level, the NAND gate 59 outputs a signal C59 having a H level, regardless of a level of the signal C58. At this time, the signal ACT is not applied to the logic circuit, so the inverter 53 retains the signal C53 to have the H level. Thus, the logic circuit changes over the selecting signal φSEL to have an L level. That is, the logic circuit is placed in a state where the signal PRE is applied thereto before the signal ACT is applied thereto.

As described above, the present embodiment is designed such that the column address control signal φ3 is produced by selecting one of the control signals φ1, φ2, which is delayed, in accordance with the selecting signal φSEL. Thus, the present embodiment is capable of operating in either the operation mode of FIGS. 3A–3I or the operation mode of FIGS. 4A–4I without programming, which is made intentionally from the external of the synchronous DRAM. In addition, the internal portions of the synchronous DRAM are capable of operating without counting a number of cycles, which elapse from ACT to READ. Further, the fixed time tRCD itself is set as the delay time for the wait time delay circuit provided inside of the row address control circuit 13. So, unlike the foregoing related art, it is unnecessary to set a time of "tRCD—(1 cycle)". For this reason, it is possible to set substantially the same process characteristic, source voltage characteristic and temperature characteristic between the measured time of tRCD and the time being measured from ACT to sense completion. Therefore, it is possible to achieve optimization design with minimizing operation margins.

[B] Embodiment 2

Figure 5:
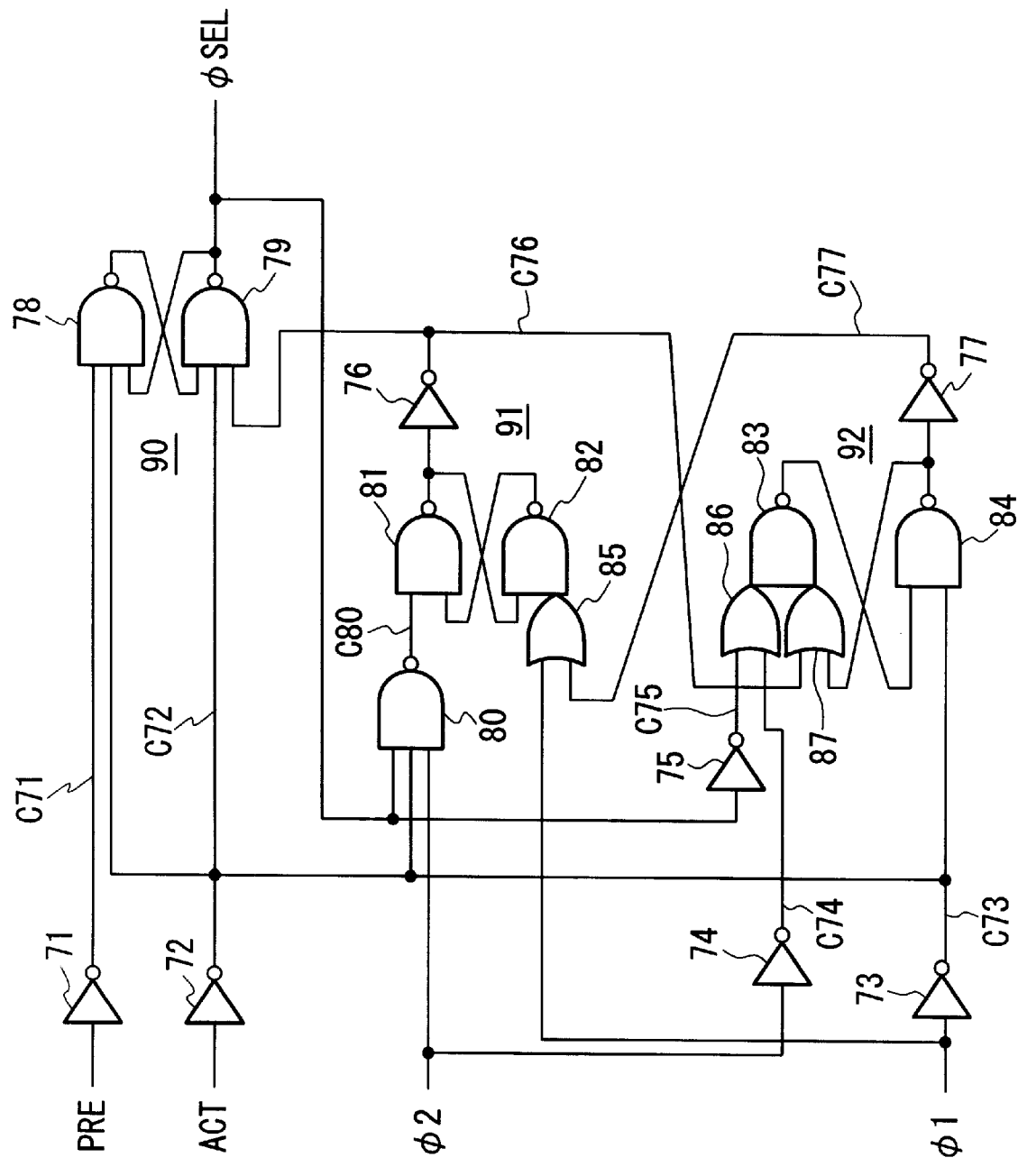
FIG. 5 is a block diagram showing a configuration of a logic circuit, which is provided inside of the burst control circuit to produce the selecting signal $\phi$SEL in accordance with embodiment 2 of the invention.

Next, a description will be given with respect to a synchronous DRAM of the embodiment 2, a configuration of which is basically identical to the aforementioned configuration (see FIG. 1) of the synchronous DRAM of the embodiment 1. The embodiment 2 differs from the embodiment 1 in conditions for producing the selecting signal φSEL in the burst control circuit 19. For this reason, a block diagram is not presented to show the configuration of the synchronous DRAM in accordance with the embodiment 2. In the case of FIGS. 4A–4I, the burst control circuit 19 normally produces the column address control signal φ3 from the control signal φ1 if the control signal φ1 is delayed from the control signal φ2. However, the embodiment 2 is characterized by that the burst control circuit 19 is changed over in mode when gaps occur in read operations while the column address control signal φ3 is currently produced from the control signal φ1. That is, the burst control circuit 19 is changed over in mode such that the column address control signal φ3 is to be produced from the control signal φ2, which is changed from the control signal φ1. FIG. 5 is a block diagram showing a configuration of a logic circuit, which is provided inside of the burst control circuit 19 to produce the selecting signal φSEL in accordance with the embodiment 2. Like the aforementioned description regarding the logic circuit of FIG. 2 in the embodiment 1, details of the logic circuit of FIG. 5 will be described later after description of overall operations of the synchronous DRAM in the embodiment 2.

Now, the overall operations of the synchronous DRAM of the embodiment 2 will be described with reference to FIGS. 6A–6I. Herein, operations of the embodiment 2 that the synchronous DRAM performs in a period of time between times t61 and t65 are substantially identical to the foregoing operations of the embodiment 1 that the synchronous DRAM performs in a period of time between the times t31 and t42 (see FIGS. 4A–4I). However, the embodiment 2 differs from the embodiment 1 in operations after the time t65. In the embodiment 1, a first read command READ is applied to the synchronous DRAM after an active command ACT (see FIG. 4B). Herein, a second read command READ is applied to the synchronous DRAM at the timing (t42), which is two clock cycles later than the timing (t32) at which the first read command READ is applied to the synchronous DRAM. In contrast to the embodiment 1, the embodiment 2 is designed to cope with a situation where a second read command READ is applied to the synchronous DRAM at timing (t69, see FIG. 6B), which is three clock cycles later than timing at which a first read command READ is applied to the synchronous DRAM. That is, if the present embodiment performs burst read operations of two bits with respect to one read command READ, there occurs a gap of one clock cycle in read operations because three clock cycles are provided between the timing of the first read command READ and the timing of the second read command READ. For this reason, if the second read command READ is applied to the synchronous DRAM at time t65 as similar to the foregoing embodiment 1 (see FIG. 4B), the burst read control circuit 15 produces a pulse of a control signal φ2 (drawn with a dashed line in FIG. 6F) at time t66. Actually, however, no pulse is produced as the control signal φ2 at time t66.

Figure 6:
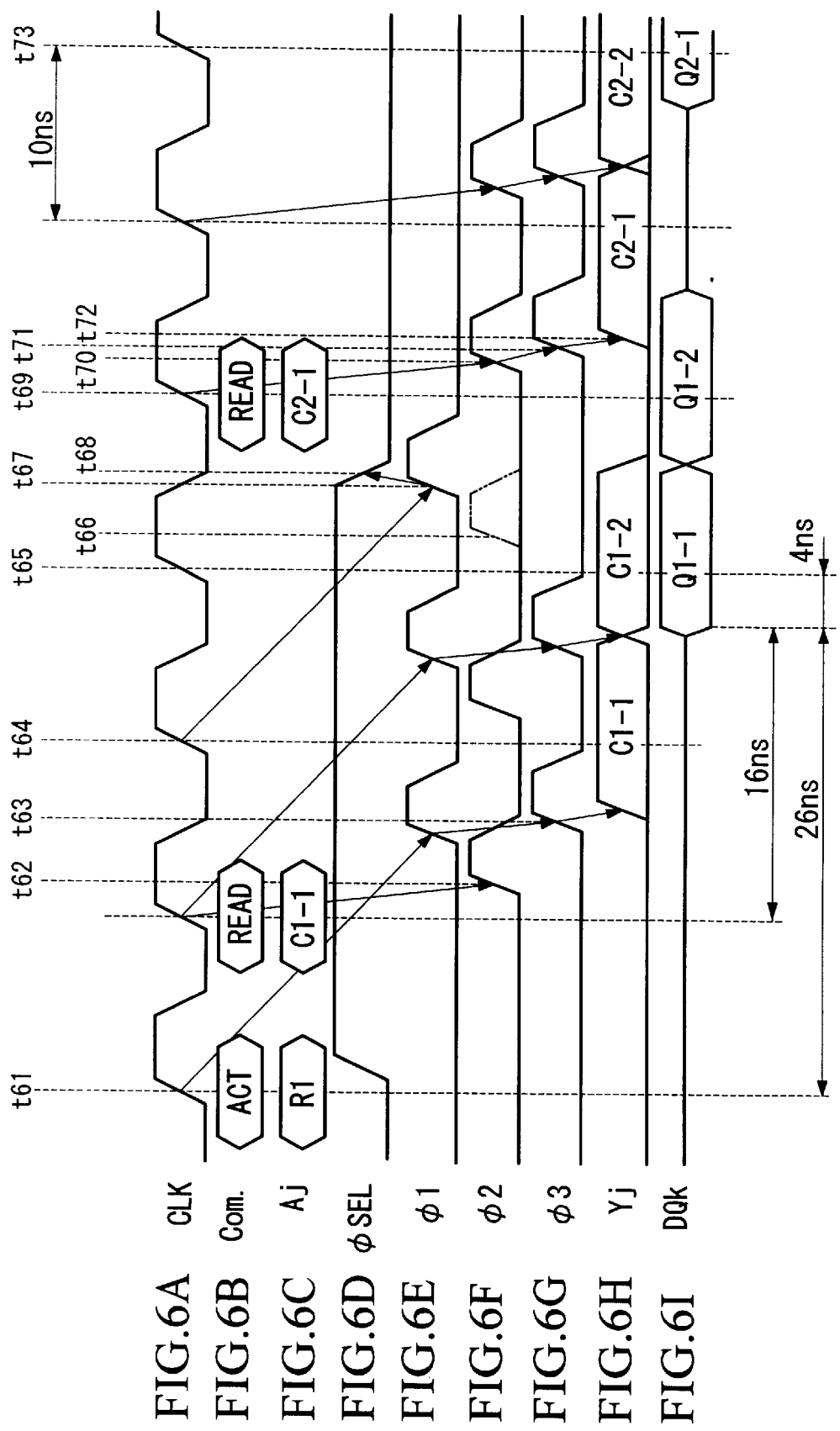
FIG. 6A is a time chart showing a clock signal CLK in the embodiment 2.
FIG. 6B is a time chart showing commands Com. in the embodiment 2.
FIG. 6C is a time chart showing an address signal Aj in the embodiment 2.
FIG. 6D is a time chart showing a selecting signal $\phi$SEL in the embodiment 2.
FIG. 6E is a time chart showing a control signal $\phi$1 in the embodiment 2.
FIG. 6F is a time chart showing a control signal $\phi$2 in the embodiment 2.
FIG. 6G is a time chart showing a column address control signal $\phi$3 in the embodiment 2.
FIG. 6H is a time chart showing a column address Yj in the embodiment 2.
FIG. 6I is a time chart showing data DQk in the embodiment 2.

Then, the row address control circuit 13 produces a pulse of a control signal φ1 (see FIG. 6E) at time t67, at which the time tRCD elapses from a leading edge of a pulse of the system clock signal CLK at time t64 (see FIG. 6A). For this reason, the control signal φ1 is detected prior to the control signal φ2. Thus, the burst control circuit 19 changes over the selecting signal φSEL to have an L level, so that the burst control circuit correspondingly changes over the mode thereof such that the column address control signal φ3 is produced from the control signal φ2. The selecting signal φSEL output from the burst control circuit 19 is supplied to the row address control circuit 13. Thus, the row address control circuit 13 stops operation of the wait time delay circuit therein. Therefore, the row address control circuit 13 does not produce the control signal φ1 anymore. Then, the second read command READ is applied to the synchronous DRAM at time t69. Operations of the embodiment 2 that the synchronous DRAM performs in a period of time between times t69 and t73 are similar to the foregoing operations of the embodiment 1 that the synchronous DRAM performs in a period of time between times t12 and t22 (see FIGS. 3A–3I). That is, the synchronous DRAM performs burst read operations while producing the column address control signal φ3 based on the control signal φ2.

Next, operations of the logic circuit of FIG. 5, which is used to produce the selecting signal φSEL, will be described in detail with reference to FIGS. 6A to 6I. In FIG. 5, reference numerals 71 to 77 designate inverters, reference numerals 78 to 84 designate NAND gates, and reference numerals 85 to 87 designate OR gates. Herein, the NAND gates 78, 79 configure a flip-flop 90, the NAND gates 81, 82 configure a flip-flop 91, and the NAND gates 83, 84 configure a flip-flop 92. In an initial condition, all of the flip-flops 90 to 92 are reset by a reset signal φnot shown). As similar to the foregoing embodiment 1, a signal PRE is applied to the logic circuit before a signal ACT is applied to the logic circuit. Thus, the inverter 71 outputs a signal C71 having an L level, while the inverter 72 outputs a signal C72 having a H level because the signal ACT having a H level is not applied to the inverter 72. In addition, the inverter 76 outputs a signal C76 having a H level because the flip-flop 91 is reset, so that the flip-flop 90 remains being reset. Thus, the selecting signal φSEL output from the flip-flop 90 remains at an L level.

At time t61 when the active command ACT is applied to the synchronous DRAM (see FIG. 6B), the inverter 72 changes over the signal C72 to have an L level. Thus, the flip-flop 90 is placed in a "set" state, by which the selecting signal φSEL is changed over to have a H level. At this time, the flip-flop 92 remains being reset, so that the inverter 77 outputs a signal C77 having a H level. So, an output of the OR gate 85 is set at a H level. In addition, the burst read control circuit 15 does not produce the control signal φ2, so that the NAND gate 80 outputs a signal C80 which is retained at a H level. For the reasons described above, the flip-flop 91 is changed in state and remains being reset. In addition, the row address control circuit 13 does not produce the control signal φ1, so the inverter 73 outputs a signal C73 which is retained at a H level. Further, the inverter 74 outputs a signal C74 which is retained at a H level because the control signal φ2 is not produced, so an output of the OR gate 86 is at a H level. Furthermore, the output signal C76 of the inverter 76 is retained at a H level because the flip-flop 91 remains being reset, so an output of the OR gate 87 is at a H level. Based on the conditions described above, the flip-flop 92 is placed in a "set" state.

Then, at time t62, the burst read control circuit 15 changes over the control signal φ2 to have a H level. At this time, the selecting signal φSEL is at the H level, while the output signal C73 of the inverter 73 is at the H level because the control signal φ1 is not produced. Thus, the NAND gate 80 changes over the signal C80 to have an L level, by which the flip-flop 90 is placed in a "set" state. As a result, the inverter 76 changes over the signal C76 to have an L level. Thus, the flip-flop 90 is placed in the "set" state again, so that the selecting signal φSEL remains at the H level. In addition, the inverter 74 changes over the signal C74 to have an L level because the control signal φ2 has the H level, while the inverter 75 outputs a signal C75 having an L level because the selecting signal φSEL is at the H level. Thus, an output of the OR gate 86 is set at an L level. In addition, the inverter 73 outputs the signal C73 having the H level because the control signal φ1 is not produced. As a result, the flip-flop 92 is reset.

Next, at time t63 when the row address control circuit 13 produces a control signal φ1 having a H level so that the inverter 73 correspondingly outputs a signal C73 having an L level, the flip-flop 92 is placed in a "set" state. Because the signal C73 has the L level, the NAND gate 80 outputs a signal C80 having a H level. In addition, an output of the OR gate 85 is set at a H level because the control signal φ1 has the H level. For the reasons described above, the flip-flop 91 remains in the "set" state. Therefore, the inverter 76 retains the output signal C76 to be at the L level, so that the flip-flop 90 still remains in the "set" state. Thus, the selecting signal φSEL remains at the H level. Thereafter, the control signal φ1 is changed in level from the H level to the L level. So, the control signals φ1, φ2 and the signals PRE, ACT are all at the L level at time t64, for example.

In the above condition, the control signal φ2 is at the L level, so the inverter 74 outputs a signal C74 having a H level, so that an output of the OR gate 86 is at a H level. In addition, the flip-flop 91 is placed in the "set" state, so the signal C76 is at the L level. Further, the signal C73 is at the H level because the control signal φ1 has the L level. Thus, the flip-flop 92 remains in the "set" state. Herein, the inverter 77 produces a signal C77 which is at an L level because the control signal φ1 is at the L level while the flip-flop 92 is placed in the "set" state. For this reason, an output of the OR gate 85 is at an L level. At this time, the NAND gate 80 outputs a signal C80 which is at a H level because the control signal φ2 is at the L level. As a result, the flip-flop 91 is reset.

When the flip-flop 91 is reset, the inverter 76 outputs a signal C76 which is at a H level. As described above, the flip-flop 92 is not changed in state thereof and remains in the "set" state because the output of the OR gate 86 is at the H level so that an output of the NAND gate 83 is at an L level. In addition, the flip-flop 90 is not changed in state thereof and remains in the "set" state because all the signals C71, C72, C73 are at the H level while the flip-flop 91 is reset so that the signal C76 is at the H level. Thus, the selecting signal φSEL remains at the H level. Thereafter, the control signals φ2, φ1 are sequentially changed in levels thereof to H levels respectively, then, they are restored in levels thereof to L levels respectively. In this case, the logic circuit of FIG. 5 similarly repeats the foregoing operations, which are made in a period of time between times t62 and t64.

If the burst read control circuit 15 does not produce a pulse of the control signal φ2 at time t66, there occurs an event in which pulses are consecutively produced for the control signal φ1 two times when the control signal 1 is increased in level to a H level at time t67. At this time, the signal C73 is set at an L level, so that the flip-flop 92 is placed in the "set" state again. In addition, the control signal φ1 is at the H level so that an output of the OR gate 85 is at a H level. Further, the signal C80 is at the H level because the control signal φ2 is at the L level. Therefore, the flip-flop 91 is not changed in state thereof and remains in the "reset" state. As a result, the signal C76 remains at the H level. At this time, both of the signals C71, C72 are at the H level, but the signal C73 is at the L level. Thus, the flip-flop 90 is reset, so that the selecting signal φSEL is changed in level to an L level at time t68.

Then, at time t70, the burst control circuit 15 produces a pulse of the control signal φ2. At this time, the inverter 75 outputs a signal C75 which is at a H level because the selecting signal φSEL is at the L level. So, an output of the OR gate 86 is at a H level. In addition, the flip-flop 91 remains being reset, so that the signal C76 is at the H level. So, an output of the OR gate 87 is at a H level as well. For the reasons described above, the flip-flop 92 is set again, so that the signal C77 still remains at the L level. Further, the signal C80 is at the H level because the selecting signal φSEL is at the L level. Furthermore, an output of the OR gate 85 is at an L level because the control signal φ1 is at the L level while the signal C77 is at the L level. As a result, the flip-flop 91 is reset again. Thus, the signals C71, C72, C73 and C76 are all at the H levels respectively while the flip-flop 90 still remains in the "reset" state, so that the selecting signal φSEL is retained at the L level. Thereafter, the burst read control circuit 15 produces a pulse of the control signal φ2. In this case, the aforementioned operations are similarly repeated, so that the selecting signal φSEL is retained at the L level.

Suppose a situation where the control signals φ1, φ2 and the signals PRE, ACT are all at L levels respectively. If such a situation occurs under the condition where both of the flip-flops 91, 92 are placed in the "set" states, the flip-flop 91 is reset. However, if one of the flip-flops 91, 92 is set while the other is reset, no changes occur in states of the flip-flops 90 to 92. So, explanation regarding the above situation is omitted. Incidentally, operations of the embodiment 2 after time t65 in FIGS. 6A–6I are similar to the foregoing operations of the embodiment 1 in FIGS. 3A–3I.

As described heretofore, the present embodiment is provided to cope with a vacant cycle in which a read operation is not performed. That is, to stop such a vacant cycle, the burst control circuit 19 temporarily changes over the basis for creation of the column address control signal φ3 from the control signal φ1 to the control signal φ2. After the above basis is changed over to the control signal φ2, it is unnecessary to operate the wait time delay circuit for creation of the control signal φ1. Thus, it is possible to reduce an amount of electric current being consumed by stopping operation of the wait time delay circuit. In the case where a read command READ is applied to the synchronous DRAM every two clock cycles as shown in FIGS. 4A–4I, the synchronous DRAM repeats the same operations, which are described in connection with the aforementioned embodiment 1, even in the embodiment 2. In the case of FIGS. 3A–3I, the synchronous DRAM performs the same operations, regardless of differences between the embodiments 1, 2.

The aforementioned embodiments 1, 2 describe about the operation timings of the synchronous DRAM specifically with respect to the read commands READ. Of course, this invention can be similarly used for operations of the synchronous DRAM with regard to write commands as well. The embodiments merely describe an example of application of this invention, which is applied to the synchronous DRAM. However, application of this invention is not limited to the synchronous DRAMs. Thus, this invention is generally applicable to synchronous memories of the address multiplex type. In case of the double-data-rate synchronous DRAM (or DDR-SDRAM), for example, data speed is double of clock speed, so that clock frequency is relatively low, and latency is small. If this invention is applied to the DDR-SDRAM, it is possible to demonstrate remarkable effects in operations.

Lastly, this invention has a variety of technical features and effects, which are summarized as follows:

(1) The synchronous DRAM is controlled in response to first and second control signals (φ1, φ2). Herein, the first control signal is produced after a lapse of the predetermined delay time which elapses after the timing that an active command is applied to the synchronous DRAM, wherein the first control signal consists of pulses, each of which is produced every clock cycle. The second control signal is produced after a read command or a write command is applied to the synchronous DRAM, wherein the second control signal consists of pulses, each of which is produced every clock cycle. A third control signal (φ3) is produced from one of the first and second control signals which is delayed and is used to determine the timing at which the column address is supplied to the memory cell array.

(2) If a gap occurs in read operations or write operations under the condition where the third control signal is produced from the first control signal, the burst control circuit changes over the basis for creation of the third control signal from the first control signal to the second control signal, so that the third control signal is to be produced from the second control signal. Thus, the system is not required to perform programming with respect to the RAS latency. In addition, it is unnecessary to design the delay time with respect to each latency.

(3) It is possible to set the same process characteristic, source voltage characteristic and temperature characteristic between the measured time of tRCD and the time being required for access completion after the active command. Thus, it is possible to achieve optimization design with minimal operation margins.

(4) In a period of time in which the third control signal is produced from the second control signal, the first control signal is controlled not being produced. In such a period of time, it is possible to stop operation of the delay circuit, which is required to delay the first control signal by the predetermined time. Thus, it is possible to reduce an amount of electric current being consumed.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A synchronous semiconductor storage device which accesses a memory cell array consisting of rows and columns with respect to row addresses and column addresses, being sequentially supplied in a time-division manner, in synchronization with cycles of a clock signal being supplied from an external, said synchronous semiconductor storage device comprising:

first signal creation means for producing a first control signal consisting of pulses, which are produced in synchronization with the cycles of the clock signal after a lapse of a predetermined delay time, which elapses from a timing to apply an active command to activate a row of the memory cell array designated by an row address;

second signal creation means for producing a second control signal consisting of pulses, which are produced in synchronization with the cycles of the clock signal after a timing to apply a read command or a write command to access the memory cell array; and third signal creation means for producing a third control signal for determining a timing to designate a column address of the memory cell array, wherein the third control signal is produced based on one of the first control signal and the second control signal which is delayed.

2. A synchronous semiconductor storage device according to claim 1 wherein when a gap is detected in read operations or write operations to the memory cell array while the third signal creation means produces the third control signal from the first control signal, the third signal creation means changes over a basis for creation of the third signal from the first control signal to the second control signal so that the third control signal is to be produced from the second control signal.

3. A synchronous semiconductor storage device according to claim 1 wherein in a period of time in which the third signal creation means produces the third control signal from the second control signal, the first signal creation means stops producing the first control signal.

4. A synchronous semiconductor storage device according to claim 2 wherein in a period of time in which the third signal creation means produces the third control signal from the second control signal, the first signal creation means stops producing the first control signal.

5. A synchronous semiconductor storage device comprising:

a memory cell array consisting of memory cells, which are arranged in a matrix form in accordance with rows and columns;

a row address producer for producing a row address to activate a corresponding row of the memory cell array in response to an active command;

a column address producer for producing a column address to activate a corresponding column of the memory cell array in response to a read command;

a first signal producer for producing a first control signal consisting of pulses, which are produced in synchronization with cycles of a clock signal being given from an external after a lapse of a predetermined delay time, which elapses from a timing of the active command;

a second signal producer for producing a second control signal consisting of pulses, which are produced in synchronization with the cycles of the clock signal and in response to the read command; and a third signal producer for producing a third control signal consisting of pulses, which are produced based on either the first control signal or the second control signal which is delayed, so that the column address is applied to the memory cell array in response to the third control signal.

6. A synchronous semiconductor storage device according to claim 5 wherein when a gap occurs in read operations so that the second control signal is delayed from the first control signal under a condition where the third signal producer produces the third control signal from the first control signal, the third signal producer changes over a basis for creation of the third signal from the first control signal to the second control signal so that the third signal producer starts producing the third control signal based on the second control signal.

7. A synchronous semiconductor storage device according to claim 6 wherein in a period of time in which the third signal producer produces the third control signal from the second control signal, the third signal producer controls the first signal producer to stop producing the first control signal.

8. A synchronous semiconductor storage device according to claim 5 or 6 wherein in a period of time in which the third signal producer produces the third control signal from the second control signal, the third signal producer controls the first signal producer to stop producing the first control signal.

9. A synchronous semiconductor storage device according to claim 5 wherein the predetermined delay time corresponds to row address strobe latency.

10. A synchronous semiconductor storage device according to claim 5 further comprising a selecting signal producer for producing a selecting signal based on the first control signal and the second control signal, by which the first signal producer stops producing the first control signal in a period of time in which the third signal producer produces the third control signal from the second control signal.

* * * * *